(12) United States Patent
Morikazu

(10) Patent No.: US 12,290,881 B2
(45) Date of Patent: May 6, 2025

(54) LASER PROCESSING METHOD

(71) Applicant: DISCO CORPORATION, Tokyo (JP)

(72) Inventor: Hiroshi Morikazu, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 215 days.

(21) Appl. No.: 18/192,104

(22) Filed: Mar. 29, 2023

(65) Prior Publication Data

US 2023/0321761 A1    Oct. 12, 2023

(30) Foreign Application Priority Data

Apr. 7, 2022   (JP) ................................. 2022-063904

(51) Int. Cl.

| | |
|---|---|
| *B23K 26/53* | (2014.01) |
| *B23K 26/364* | (2014.01) |
| *H01L 21/268* | (2006.01) |
| *H01L 21/304* | (2006.01) |
| *H01L 21/78* | (2006.01) |
| *B23K 103/00* | (2006.01) |

(52) U.S. Cl.
CPC ............ *B23K 26/53* (2015.10); *H01L 21/268* (2013.01); *B23K 2103/56* (2018.08)

(58) Field of Classification Search
CPC ...... B23K 26/53; B23K 26/364; B23K 26/38; B23K 26/702; B23K 26/354; B23K 26/0853; B23K 2103/56; H01L 21/268; H01L 21/3043; H01L 21/78
See application file for complete search history.

(56) References Cited

U.S. PATENT DOCUMENTS

| | | | | |
|---|---|---|---|---|
| 2014/0334511 | A1* | 11/2014 | Takeda | ................. H01S 5/32341 372/41 |
| 2018/0012804 | A1* | 1/2018 | Tateishi | ................... H01L 21/78 |
| 2018/0102288 | A1* | 4/2018 | Bae | .......................... H01L 21/78 |
| 2018/0161919 | A1* | 6/2018 | Yamada | ................. B23K 26/02 |

FOREIGN PATENT DOCUMENTS

| | | |
|---|---|---|
| JP | 2002192370 A | 7/2002 |
| JP | 2004188475 A | 7/2004 |
| JP | 2014221483 A | 11/2014 |

* cited by examiner

*Primary Examiner* — Galen H Hauth
*Assistant Examiner* — Baileigh Kate Darnell
(74) *Attorney, Agent, or Firm* — Greer, Burns & Crain, Ltd

(57) ABSTRACT

A laser processing method includes forming a first processing mark to form an origin of dividing or a dividing groove with a laser beam in a first direction, and forming a second processing mark by forming an origin of dividing or a dividing groove with the laser beam in a second direction that intersects the first direction. An unprocessed region in which the processing is not executed remains at an intersection at which the first direction and the second direction intersect each other. The method further includes processing the unprocessed region. The unprocessed region processing step forms a coupling processing mark that couples the first processing mark and the second processing mark to each other to form an origin of dividing or a dividing groove with the laser beam in a direction arising from setting an inclination with respect to the first direction or the second direction.

8 Claims, 3 Drawing Sheets

LASER PROCESSING METHOD

BACKGROUND OF THE INVENTION

Field of the Invention

The present invention relates to a laser processing method in which a plate-shaped workpiece is irradiated with a laser beam and processing is executed.

Description of the Related Art

A wafer on which multiple devices such as integrated circuits (ICs) and large-scale integrations (LSIs) are formed on a front surface in such a manner as to be marked out by multiple planned dividing lines that intersect each other is divided into individual device chips through processing for the planned dividing lines by laser processing apparatus, and the device chips obtained by the dividing are used for pieces of electrical equipment such as mobile phones and personal computers.

The following types exist as types of the laser processing apparatus: a type that positions the focal point of a laser beam with a wavelength having transmissibility with respect to a wafer to the inside of the wafer and executes irradiation to form a modified layer (for example, refer to Japanese Patent No. 3408805); a type that positions the focal point of a laser beam with a wavelength having transmissibility with respect to a wafer to the inside of the wafer and executes irradiation to form a shield tunnel formed of a fine pore and an altered layer surrounding the fine pore (for example, refer to Japanese Patent Laid-open No. 2014-221483); and a type that executes irradiation with the focal point of a laser beam with a wavelength having absorbability with respect to a wafer along a planned dividing line of the wafer to form a groove by ablation processing (for example, refer to Japanese Patent Laid-open No. 2004-188475). The laser processing apparatus is selected as appropriate corresponding to the workpiece including the wafer.

SUMMARY OF THE INVENTION

However, there is a problem that, due to the material or the direction of the crystal orientation regarding the wafer, cracks of approximately several tens of micrometers are radially generated in unintended directions at the intersection of planned dividing lines orthogonal to each other and the quality of device chips is lowered when the planned dividing lines are irradiated with a laser beam and processing is executed.

In particular, when the crystal orientation deviates from the direction of the planned dividing lines, there is a problem that cracks are generated in unintended directions different from the planned dividing lines and the quality of device chips is lowered. Furthermore, also in a technique in which laser processing is executed for a plate-shaped workpiece of silicon (Si), silicon carbide (SiC), or the like to form the workpiece into a desired form, cracks in unintended directions are generated at an intersection similarly to the above description and a problem similar to the above-described problem occurs.

Thus, an object of the present invention is to provide a laser processing method that can solve a problem that the quality of members formed from a plate-shaped workpiece is lowered due to generation of cracks of approximately several tens of micrometers in a radial manner at the intersection at which a first direction and a second direction in which origins of dividing or dividing grooves are formed in the workpiece by laser processing intersect.

In accordance with an aspect of the present invention, there is provided a laser processing method in which a plate-shaped workpiece is irradiated with a laser beam and processing is executed. The laser processing method includes a first processing step of forming a first processing mark by executing processing to form an origin of dividing or a dividing groove through executing irradiation with the laser beam in a first direction and a second processing step of forming a second processing mark by executing processing to form an origin of dividing or a dividing groove through executing irradiation with the laser beam in a second direction that intersects the first direction. An unprocessed region in which the processing is not executed is caused to remain at an intersection at which the first direction and the second direction intersect each other in the first processing step or the second processing step. The laser processing method further includes an unprocessed region processing step of processing the unprocessed region. The unprocessed region processing step forms a coupling processing mark that couples the first processing mark and the second processing mark by executing processing to form an origin of dividing or a dividing groove through executing irradiation with the laser beam in a direction arising from setting an inclination with respect to the first direction or the second direction.

Preferably, the first processing mark and the second processing mark are modified layers formed through positioning the focal point of a laser beam with a wavelength having transmissibility with respect to the workpiece to the inside of the workpiece and executing irradiation. Alternatively, the first processing mark and the second processing mark are shield tunnels that are formed through positioning the focal point of a laser beam with a wavelength having transmissibility with respect to the workpiece to the inside of the workpiece and executing irradiation and are formed of a fine pore and an altered layer surrounding the fine pore. Preferably, the first processing mark and the second processing mark are grooves formed by ablation processing through positioning the focal point of a laser beam with a wavelength having absorbability with respect to the workpiece to the workpiece and executing irradiation.

Preferably, the plate-shaped workpiece is a wafer on which a plurality of devices are formed on a front surface in such a manner as to be marked out by a plurality of planned dividing lines that intersect each other, and the first direction and the second direction are directions of the planned dividing lines. Preferably, the plate-shaped workpiece is a Si wafer or a gallium arsenide (GaAs) wafer in which a crystal orientation is inclined by 45 degrees with respect to the first direction and the second direction. Preferably, the plate-shaped workpiece is any of a SiC wafer, a lithium tantalate (LT) wafer, and a silicon dioxide ($SiO_2$) wafer.

According to the laser processing method of the present invention, the first processing mark and the second processing mark are not orthogonal to each other at the intersection at which the first direction and the second direction intersect each other and in which the origins of dividing or the dividing grooves are formed in the plate-shaped workpiece by the laser processing. This eliminates a problem that cracks of approximately several tens of micrometers are radially generated at the intersection and the quality of members formed from the workpiece is lowered.

The above and other objects, features and advantages of the present invention and the manner of realizing them will become more apparent, and the invention itself will best be

DETAILED DESCRIPTION OF THE PREFERRED EMBODIMENTS

Figure 1:
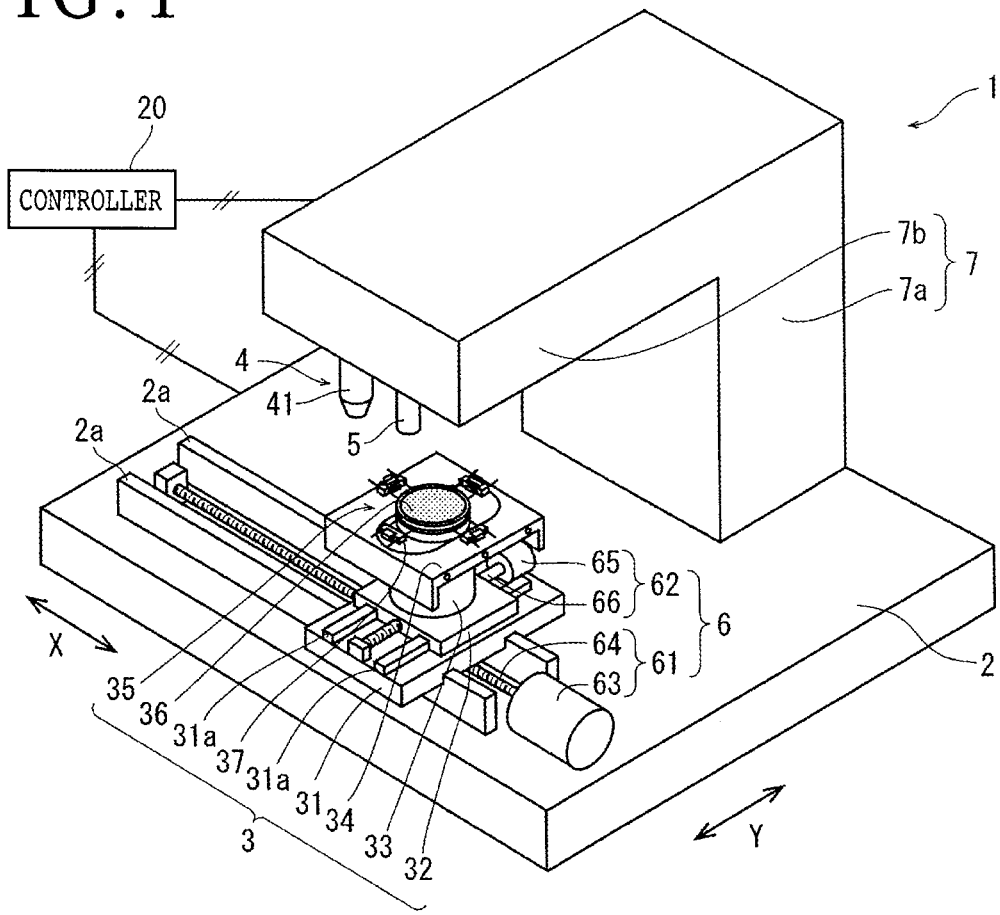
FIG. 1 is an overall perspective view of a laser processing apparatus.

A laser processing method according to an embodiment of the present invention will be described in detail below with reference to the accompanying drawings. In FIG. 1, an overall perspective view of a laser processing apparatus 1 suitable to execute the laser processing method of the present embodiment is illustrated. The laser processing apparatus 1 includes at least a holding unit 3 that is disposed over a base 2 and holds a plate-shaped workpiece to be described later, a laser beam irradiation unit 4 that irradiates the workpiece held by the holding unit 3 with a laser beam, and a controller 20.

Furthermore, the laser processing apparatus 1 includes an imaging unit 5 that images the workpiece held by the holding unit 3 and executes alignment to detect a processing position and a processing feed mechanism 6 that moves the holding unit 3 and the laser beam irradiation unit 4 relative to each other.

The holding unit 3 is means that holds the plate-shaped workpiece and, as illustrated in FIG. 1, includes a rectangular X-axis direction movable plate 31 mounted over the base 2 movably in an X-axis direction, a rectangular Y-axis direction movable plate 32 mounted over the X-axis direction movable plate 31 movably in a Y-axis direction, a circular cylindrical support column 33 fixed to the upper surface of the Y-axis direction movable plate 32, and a rectangular cover plate 34 fixed to the upper end of the support column 33. A chuck table 35 that passes through a long hole formed on the cover plate 34 and extends upward is disposed over the cover plate 34. The chuck table 35 is configured to be capable of rotating by a rotational drive mechanism that is housed in the support column 33 and is not illustrated. At the upper surface of the chuck table 35, a circular suction adhesion chuck 36 that is formed of a porous material having gas permeability and has an XY-plane identified based on an X-coordinate and a Y-coordinate as a holding surface is disposed. The suction adhesion chuck 36 is connected to suction means that is not illustrated by a flow path passing through the support column 33. Around the suction adhesion chuck 36, four clamps 37 used when the workpiece to be described later is held on the chuck table 35 are disposed at equal intervals. The workpiece can be held under suction by the suction adhesion chuck 36 by actuating the suction means.

The processing feed mechanism 6 includes an X-axis movement mechanism 61 that moves the holding unit 3 in the X-axis direction and a Y-axis movement mechanism 62 that moves the holding unit 3 in the Y-axis direction. The X-axis movement mechanism 61 converts rotational motion of a motor 63 to linear motion through a ball screw 64 and transmits the linear motion to the X-axis direction movable plate 31 to move the X-axis direction movable plate 31 in the X-axis direction along a pair of guide rails 2a disposed along the X-axis direction on the base 2. The Y-axis movement mechanism 62 converts rotational motion of a motor 65 to linear motion through a ball screw 66 and transmits the linear motion to the Y-axis direction movable plate 32 to move the Y-axis direction movable plate 32 in the Y-axis direction along a pair of guide rails 31a disposed along the Y-axis direction on the X-axis direction movable plate 31.

The laser processing apparatus 1 includes a frame body 7 composed of a vertical wall part 7a erected on a lateral side of the X-axis movement mechanism 61 and the Y-axis movement mechanism 62 over the base 2 and a horizontal wall part 7b extending from an upper end part of the vertical wall part 7a in the horizontal direction. An optical system that configures the above-described laser beam irradiation unit 4 and the imaging unit 5 are housed inside the horizontal wall part 7b of the frame body 7. Although description about details is omitted, in the optical system of the laser beam irradiation unit 4, a laser oscillator that emits a laser beam LB with a desired wavelength, an attenuator that adjusts the output power of the laser beam LB emitted from the laser oscillator, a reflective mirror that converts the optical path of the laser beam LB toward the side of a light collector 41 including a collecting lens that is not illustrated, and so forth are included. The laser beam irradiation unit 4 is controlled by the controller 20, and the repetition frequency, the spot diameter, the average output power, and so forth are adjusted.

The controller 20 is configured by a computer and includes a central processing unit (CPU) that executes calculation processing in accordance with a control program, a read only memory (ROM) that stores the control program and so forth, a readable-writable random access memory (RAM) for temporarily storing a detection value obtained by detection, a calculation result, and so forth, an input interface, and an output interface (illustration about details is omitted). Besides the above-described laser beam irradiation unit 4, the imaging unit 5, the X-axis movement mechanism 61, the Y-axis movement mechanism 62, and so forth are connected to the controller 20 and are controlled. In addition, information relating to the position to be processed, which is imaged and detected by the imaging unit 5, is stored in an appropriate memory.

The above-described laser processing apparatus 1 substantially includes the configuration described above. The laser processing method of the present embodiment executed by using the laser processing apparatus 1 will be described below.

Figure 2:
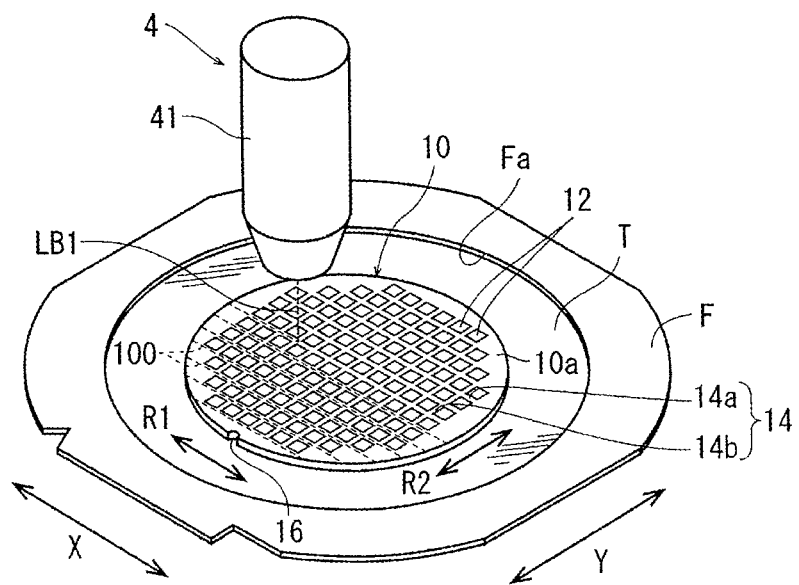
FIG. 2 is a perspective view illustrating a form in which a first processing step is executed by the laser processing apparatus illustrated in FIG. 1.
Figure 3A:
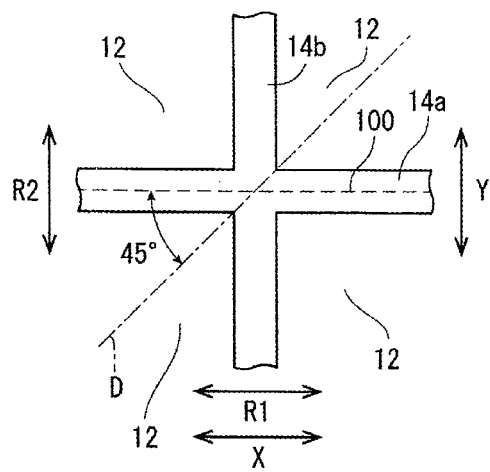
FIG. 3A is a plan view illustrating part of the form in which the first processing step illustrated in FIG. 2 is executed, in an enlarged manner.

The plate-shaped workpiece to be processed by the laser processing method of the present embodiment is a wafer 10 of Si on which multiple devices 12 are formed on a front surface 10*a* in such a manner as to be marked out by multiple planned dividing lines 14 that intersect each other as the like one illustrated in FIG. 2, for example. The wafer 10 is supported by an annular frame F having an opening Fa in which the wafer 10 can be housed through a protective tape T. The planned dividing lines 14 include multiple first planned dividing lines 14*a* along a first direction R1 in the wafer 10 and multiple second planned dividing lines 14*b* along a second direction R2 orthogonal to the first direction R1. The front surface 10*a* of the wafer 10 is segmented in a lattice manner by the first planned dividing lines 14*a* and the second planned dividing lines 14*b*. A notch 16 for identifying the crystal orientation is formed at the outer circumferential edge of the wafer 10 of the present embodiment. In the present embodiment, as illustrated in FIG. 3A, the crystal orientation D is inclined by 45 degrees with respect to the first planned dividing lines 14*a* and the second planned dividing lines 14*b* in plan view.

The above-described wafer 10 is sucked by the chuck table 35 of the above-described holding unit 3, and the annular frame F is grasped and fixed by the clamps 37. Subsequently, the X-axis movement mechanism 61 and the Y-axis movement mechanism 62 are actuated to position the wafer 10 directly under the imaging unit 5. Then, the wafer 10 is photographed by the imaging unit 5, and alignment to detect, on the basis of the XY-coordinates, the positions of the first planned dividing lines 14*a* along the first direction R1 and the second planned dividing lines 14*b* along the second direction R2 orthogonal to the first direction R1 is executed. Moreover, the direction of the first planned dividing lines 14*a* is aligned with the X-axis direction, and the second planned dividing lines 14*b* are aligned in the Y-axis direction.

Subsequently, the light collector 41 of the laser beam irradiation unit 4 is positioned directly above a processing start position on the predetermined first planned dividing line 14*a* along the first direction R1 on the basis of the position information detected by the above-described imaging unit 5. Then, the focal point of a laser beam LB1 with a wavelength having transmissibility with respect to the wafer 10 is positioned to the inside of the wafer 10, and irradiation is executed. In addition, processing feed of the wafer 10 is executed in the X-axis direction. As a result, as illustrated in FIG. 3A, a first processing mark 100 formed of a modified layer that serves as an origin of dividing is formed along the predetermined first planned dividing line 14*a* of the wafer 10. After the first processing mark 100 is formed, indexing feed of the wafer 10 is executed in the Y-axis direction by the interval of the first planned dividing lines 14*a* adjacent in the Y-axis direction, and the first planned dividing line 14*a* that has not been processed is positioned directly under the light collector 41. Then, similarly to the above description, the focal point of the laser beam LB1 is positioned to the inside of this first planned dividing line 14*a* and irradiation is executed, and processing feed of the wafer 10 is executed in the X-axis direction to form the first processing mark 100 formed of a modified layer similar to the above-described one. Similarly, processing feed and indexing feed of the wafer 10 are executed in the X-axis direction and the Y-axis direction to form the first processing marks 100 similar to the above-described ones along all first planned dividing lines 14*a* along the first direction R1, so that a first processing step is completed.

The processing to form the modified layer executed in the present embodiment is executed under the following laser processing condition. Furthermore, the above-described first processing mark 100 is formed by repeatedly executing irradiation two or three times while changing the depth of the focal point when the focal point is positioned to the inside of the same first planned dividing line 14*a*. A second processing step and an unprocessed region processing step that will be described later are also executed under a laser processing condition similar to that explained below.

Figure 3B:
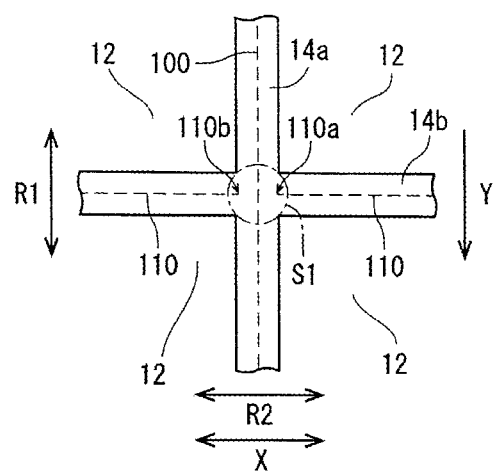
FIG. 3B is a plan view illustrating part of a form in which a second processing step is executed in an enlarged manner.

Wavelength: 1064 nm
Repetition frequency: 100 kHz
Spot diameter: 1 μm
Irradiation interval: 5 μm
Average output power: 0.5 W After the first processing step is completed, the wafer 10 is rotated by 90 degrees together with the chuck table 35, and the second planned dividing lines 14*b* that are along the second direction R2 and have not been processed are aligned in the X-axis direction as illustrated in FIG. 3B. Then, the light collector 41 of the laser beam irradiation unit 4 is positioned to a processing start position on the predetermined second planned dividing line 14*b*, and the focal point of the laser beam LB1 is positioned to the inside of the wafer 10 corresponding to this second planned dividing line 14*b* and irradiation is executed. In addition, processing feed of the wafer 10 is executed in the X-axis direction. As a result, as illustrated in FIG. 3B, a second processing mark 110 formed of a modified layer that serves as an origin of dividing is formed along the predetermined second planned dividing line 14*b* of the Here, in the present embodiment, as illustrated in the diagram, when the second processing mark 110 is formed, at the intersection at which the first planned dividing line 14*a* along the first direction R1 and the second planned dividing line 14*b* along the second direction R2 intersect each other, an unprocessed region S1 in which processing is not executed is formed between end parts 110*a* and 110*b* that sandwich the intersection. After the second processing mark 110 including the unprocessed regions S1 is formed for the second planned dividing line 14*b* in this manner, also for all of the remaining second planned dividing lines 14*b*, the focal point of the laser beam LB1 is positioned to the inside of the wafer 10, and irradiation is executed similarly to the above description to form the second processing marks 110 including the unprocessed regions S1 at the intersections at which the first planned dividing line 14*a* and the second planned dividing line 14*b* intersect each other, so that the second processing step is completed.

In the above-described embodiment, the unprocessed regions S1 that are not irradiated with the laser beam LB1 are set at the intersections at which the first planned dividing line 14*a* and the second planned dividing line 14*b* intersect each other in the second processing mark 110 formed in the second processing step, whereas the first processing mark 100 formed in the first processing step is formed also at the intersections. However, the present invention is not limited thereto. For example, the unprocessed regions S1 that are not irradiated with the laser beam LB1 may be formed at the intersections when the first processing mark 100 is formed by the first processing step, and the second processing mark 110 may be formed at the intersections when the second processing mark 110 is formed in the second processing step.

After the unprocessed regions S1 that are not irradiated with the laser beam LB1 are formed at the intersections at which the first planned dividing line 14*a* and the second planned dividing line 14*b* intersect each other in the second processing step according to the above-described embodiment, the unprocessed region processing step to be described below is executed to process the unprocessed regions S1.

Figure 4A:
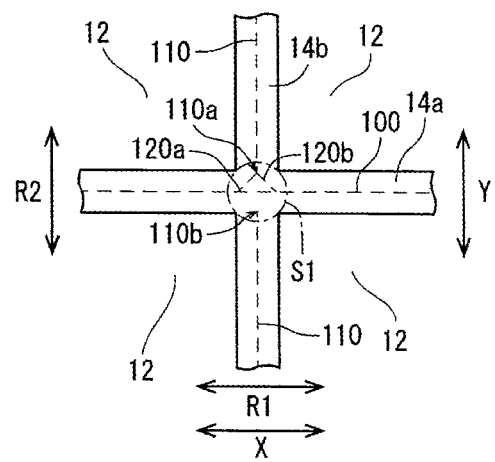
FIG. 4A and FIG. 4B are plan views illustrating a form in which an unprocessed region processing step is executed.

When the unprocessed region processing step is executed, the chuck table 35 is rotated by 90 degrees, and the first planned dividing lines 14a along the first direction R1 are aligned in the X-axis direction as illustrated in FIG. 4A. Then, the above-described laser beam irradiation unit 4, X-axis movement mechanism 61, and Y-axis movement mechanism 62 are simultaneously actuated and coupling processing marks 120a and 120b that are formed of a modified layer similar to that of the first processing mark 100 and the second processing mark 110 and couple the first processing mark 100 and the second processing mark 110 to each other are formed through executing irradiation with the laser beam LB1 with an inclination in such a manner that the locus of the irradiated part is not orthogonal to the first direction R1 and an obtuse angle is formed on the side of the device 12 between the first direction R1 and the locus of the irradiated part as illustrated in the diagram, with the end part 110a of the second processing mark 110 formed in the second planned dividing line 14b along the second direction R2 being the base end.

After the coupling processing marks 120a and 120b are formed as described above, subsequently, as illustrated in FIG. 4B, coupling processing marks 122a and 122b formed of a modified layer similar to the above-described one are formed through executing irradiation with the laser beam LB1 with an inclination in such a manner that the locus of the irradiated part is not orthogonal to the first direction R1 and an obtuse angle is formed on the side of the device 12 between the first direction R1 and the locus of the irradiated part as illustrated in the diagram, with the end part 110b of the second processing mark 110 on the lower side being the base end. At this time, the inclination angle of each coupling processing mark or the position of the end part 110a or 110b that becomes the base end when each coupling processing mark is formed is adjusted as appropriate in such a manner that the above-described coupling processing marks 120a and 120b and coupling processing marks 122a and 122b are kept from being coupled to each other at the same place on the first planned dividing line 14a. The above-described unprocessed region processing step is executed, so that the laser processing method of the present invention is completed.

After the laser processing method of the above-described present embodiment is executed, the wafer 10 is conveyed to a dividing apparatus that is not illustrated. Then, an external force is given to the wafer 10 through expanding the wafer 10 in the planar direction, or the like, and the wafer 10 is divided with use of the above-described first processing marks 100, second processing marks 110, and coupling processing marks 120a, 120b, 122a, and 122b as origins to divide the wafer 10 into chips including the individual device 12.

Figure 4B:
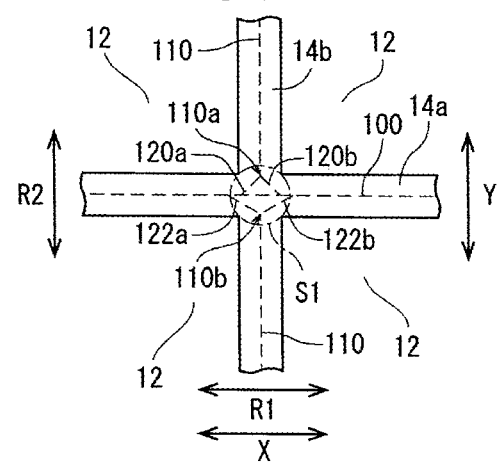

In the unprocessed region processing step explained based on FIG. 4A and FIG. 4B, description has been made about the example in which the unprocessed region S1 is formed at the intersection around which the devices 12 exist on the upper and lower sides to sandwich the first planned dividing line 14a and the devices 12 exist on the left and right sides to sandwich the second planned dividing line 14b, that is, the intersection surrounded by four devices 12, and four streaks of the coupling processing marks 120a, 120b, 122a, and 122b are formed to couple the first processing mark 100 and the second processing mark 110 to each other. However, the present invention is not limited thereto. For example, it suffices to form only the above-described coupling processing marks 120a and 120b in the case in which, in FIG. 4A, the unprocessed region S1 is formed at the intersection around which the devices 12 are not formed on the lower side of the first planned dividing line 14a but formed only on the left and right sides to sandwich the second planned dividing line 14b on the upper side of the first planned dividing line 14a. That is, it suffices for the unprocessed region processing step of the present embodiment to be what forms the coupling processing marks that couple the first processing mark 100 and the second processing mark 110 to each other only on the side on which the devices 12 are formed.

According to the laser processing method of the above-described present embodiment, the first processing marks 100 formed in the first planned dividing lines 14a along the first direction R1 and the second processing marks 110 formed in the second planned dividing lines 14b along the second direction R2 orthogonal to the first direction R1 are coupled to each other by the coupling processing marks in the direction arising from setting an inclination. Therefore, the first processing mark 100 and the second processing mark 110 are not orthogonal to each other at the intersections at which the first planned dividing line 14a and the second planned dividing lines 14b intersect each other. This eliminates the problem that cracks of approximately several tens of micrometers are radially generated at the intersection of the first planned dividing line 14a and the second planned dividing line 14b and the quality of chips including the devices 12 individually divided is lowered.

The present invention is not limited to the above-described embodiment and may be a laser processing method according to another embodiment as the like one illustrated in FIG. 5A to FIG. 6B. First, as in the above-described embodiment, the wafer 10 is sucked by the chuck table 35 of the holding unit 3 of the laser processing apparatus 1 described based on FIG. 1, and the annular frame F is grasped and fixed by the clamps 37. Subsequently, the X-axis movement mechanism 61 and the Y-axis movement mechanism 62 are actuated to position the wafer 10 directly under the imaging unit 5. Then, the wafer 10 is photographed by the imaging unit 5, and the positions of the first planned dividing lines 14a along the first direction R1 and the second planned dividing lines 14b along the second direction R2 orthogonal to the first direction R1 are detected based on the XY-coordinates. Furthermore, the direction of the first planned dividing lines 14a is aligned with the X-axis direction, and the second planned dividing lines 14b are aligned in the Y-axis direction.

Figure 5A:
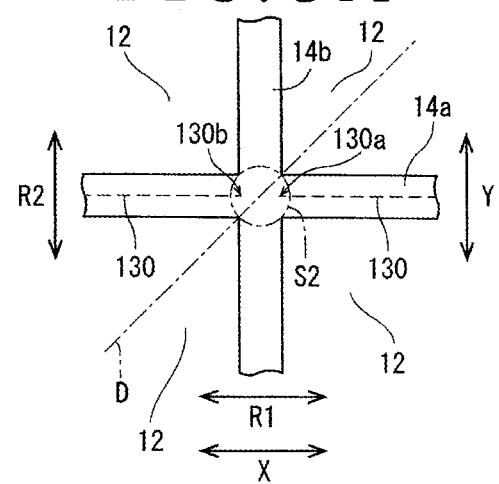
FIG. 5A is a plan view illustrating another embodiment of the first processing step.

Subsequently, the light collector 41 of the laser beam irradiation unit 4 is positioned directly above a processing start position on the predetermined first planned dividing line 14a along the first direction R1 on the basis of position information detected by the above-described imaging unit 5. Then, the focal point of the laser beam LB1 is positioned to the inside of the wafer 10, and irradiation is executed. In addition, processing feed of the wafer 10 is executed in the X-axis direction. As a result, as illustrated in FIG. 5A, a first processing mark 130 formed of a modified layer that serves as an origin of dividing of the wafer 10 is formed along the predetermined first planned dividing line 14a of the wafer 10. Here, in the present embodiment, when the first processing mark 130 is formed, at the intersection at which the first planned dividing line 14a along the first direction R1 and the second planned dividing line 14b along the second direction R2 intersect each other, an unprocessed region S2 in which processing is not executed is formed between end parts 130a and 130b that sandwich the intersection. After the first processing mark 130 including the unprocessed regions S2 is formed for the first planned dividing line 14a in this manner, also for all of the remaining first planned dividing lines 14a along the first direction R1, the focal point of the laser beam LB1 is positioned to the inside of the wafer 10 and irradiation is executed similarly to the above description to form the first processing marks 130 including the unprocessed regions S2 at the intersections at which the first planned dividing line 14a and the second planned dividing line 14b intersect each other, so that the first processing step is completed.

Figure 5B:
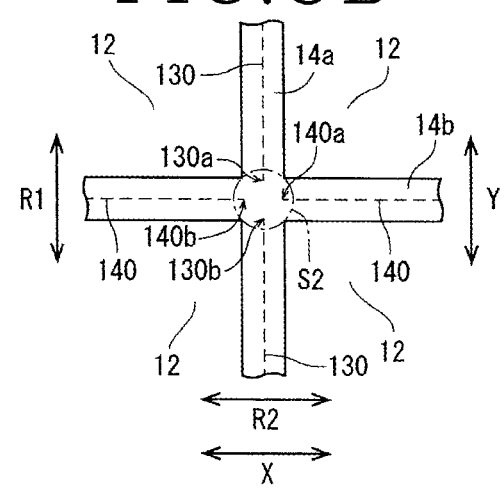
FIG. 5B is a plan view illustrating another embodiment of the second processing step.

After the above-described first processing step is completed, the wafer 10 is rotated by 90 degrees together with the chuck table 35, and, as illustrated in FIG. 5B, the second planned dividing lines 14b that are along the second direction R2 and have not been processed are aligned in the X-axis direction and the first planned dividing lines 14a are aligned in the Y-axis direction. Then, the light collector 41 of the laser beam irradiation unit 4 is positioned to a processing start position on the predetermined second planned dividing line 14b, and the focal point of the laser beam LB1 is positioned to the inside of the wafer 10 corresponding to this second planned dividing line 14b and irradiation is executed. In addition, processing feed of the wafer 10 is executed in the X-axis direction. As a result, as illustrated in FIG. 5B, a second processing mark 140 formed of a modified layer that serves as an origin of dividing is formed inside the wafer 10 along the predetermined second planned dividing line 14b of the Here, in the present embodiment, as illustrated in the diagram, irradiation with the laser beam LB1 is not executed between end parts 140a and 140b that sandwich the above-described unprocessed region S2 formed previously, when the second processing mark 140 is formed. After the second processing mark 140 is formed for the second planned dividing line 14b excluding the unprocessed region S2 in this manner, also for all of the remaining second planned dividing lines 14b, the focal point of the laser beam LB1 is positioned to the inside of the wafer 10 and irradiation is executed similarly to the above description to form the second processing marks 140, so that the second processing step is completed. In the present embodiment, as illustrated in FIG. 5B, the unprocessed regions S2 in which neither the first processing mark 130 nor the second processing mark 140 is formed are formed at the intersections at which the first planned dividing line 14a and the second planned dividing line 14b intersect each other.

After the first processing step and the second processing step are executed to form the first processing marks 130 and the second processing marks 140 and form the unprocessed regions S2 that are not irradiated with the laser beam LB1 at the intersections at which the first planned dividing line 14a and the second planned dividing line 14b intersect each other as described above, the unprocessed region processing step to be described below is executed to process the unprocessed regions S2.

Figure 6A:
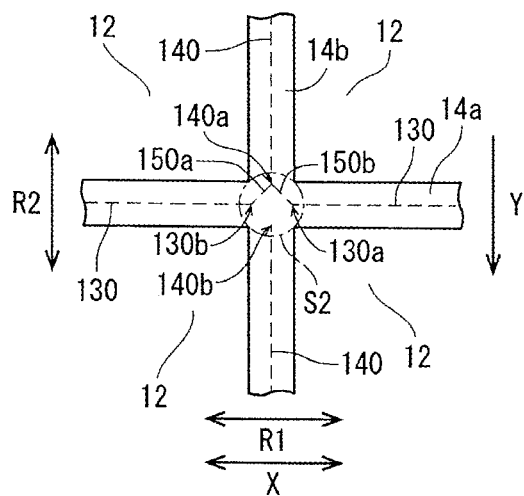
FIG. 6A and FIG. 6B are plan views illustrating another embodiment of the unprocessed region processing step.

When the unprocessed region processing step is executed, the chuck table 35 is rotated by 90 degrees, and the first planned dividing lines 14a along the first direction R1 are aligned in the X-axis direction as illustrated in FIG. 6A. Then, the above-described laser beam irradiation unit 4, X-axis movement mechanism 61, and Y-axis movement mechanism 62 are simultaneously actuated, and coupling processing marks 150a and 150b that couple the end parts 130a and 130b of the first processing mark 130 along the first direction R1 and the end part 140a of the second processing mark 140 along the second direction R2 to each other are formed by executing processing to form a modified layer through executing irradiation with the laser beam LB1 with an inclination in such a manner that the locus of the irradiated part is not orthogonal to the first direction R1 and an obtuse angle is formed on the side of the device 12 as illustrated in the diagram.

Figure 6B:
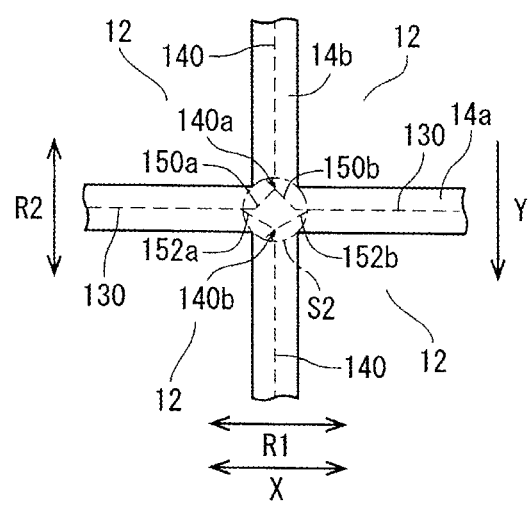

After the coupling processing marks 150a and 150b are formed as described above, subsequently, the above-described laser beam irradiation unit 4, X-axis movement mechanism 61, and Y-axis movement mechanism 62 are simultaneously actuated, and, as illustrated in FIG. 6B, coupling processing marks 152a and 152b that couple the first processing mark 130 along the first direction R1 and the end part 140b of the second processing mark 140 along the second direction R2 to each other are formed by executing processing to form a modified layer through executing irradiation with the laser beam LB1 with an inclination in such a manner that the locus of the irradiated part is not orthogonal to the first direction R1 and an obtuse angle is formed on the side of the device 12. At this time, the inclination angle of each coupling processing mark or the position when each coupling processing mark is formed is adjusted as appropriate in such a manner that the above-described coupling processing marks 150a and 150b and coupling processing marks 152a and 152b are kept from being coupled to each other at the same place on the first planned dividing line 14a. Through the above, the unprocessed region processing step is executed, and the laser processing method of the present embodiment is completed.

After the laser processing method of the above-described present embodiment is executed, the wafer 10 is conveyed to the dividing apparatus that is not illustrated, and an external force is given to the wafer 10 through expanding the wafer 10, or the like. Due to this, the above-described first processing marks 130, second processing marks 140, and coupling processing marks 150a, 150b, 152a, and 152b function as origins of dividing, and the wafer 10 can be divided into chips including the individual device 12. In addition, operation and effect similar to those of the above-described embodiment can be obtained.

Moreover, the plate-shaped workpiece to be processed by the laser processing method of the present invention is not limited to the above-described wafer 10 on which the multiple devices 12 are formed on the front surface 10a in such a manner as to be marked out by the multiple planned dividing lines 14 that intersect each other. For example, the laser processing method can be applied also to laser processing in which laser irradiation is executed for a wafer 10' as the like one illustrated in FIG. 7 to divide the wafer 10' into a plate-shaped member 11A with a desired shape, for example, a substantially rectangular shape, and an annular member 11B.

The wafer 10' illustrated in FIG. 7 is a plate-shaped wafer of Si, for example. Irradiation with a laser beam LB2 with a wavelength having absorbability with respect to the wafer 10' is executed from the laser beam irradiation unit 4 of the above-described laser processing apparatus 1, and a laser processing method to be described below is executed.

The wafer 10' illustrated in FIG. 7 is supported by the annular frame F through the protective tape T. A notch 16' for identifying the crystal orientation is formed at the outer circumferential edge of the wafer 10'. When the laser processing method of the present embodiment is executed, first, the above-described wafer 10' is sucked by the chuck table 35 of the holding unit 3 of the above-described laser processing apparatus 1, and the annular frame F is grasped and fixed by the clamps 37. Subsequently, the X-axis movement mechanism 61 and the Y-axis movement mechanism 62 are actuated to position the wafer 10' directly under the imaging unit 5. Then, the wafer 10' is photographed by the imaging unit 5 and alignment is executed, so that the position at which laser processing is to be executed is detected on the wafer 10'.

The shape of the above-described rectangular plate-shaped member 11A is stored in the controller 20 in advance, and the plate-shaped member 11A is separated from the wafer 10' and is made into a product. When the laser processing method of the present embodiment is executed, based on information relating to the stored shape of the plate-shaped member 11A, the XY-coordinates of short sides 160 are set to cause the short sides 160 to be along the first direction R1, and the XY-coordinates of long sides 170 are set to cause the long sides 170 to be along the second direction R2 orthogonal to the first direction R1. Then, the chuck table 35 is rotated to align the direction of the short sides 160 with the X-axis direction and align the direction of the long sides 170 with the Y-axis direction.

Figure 7A:
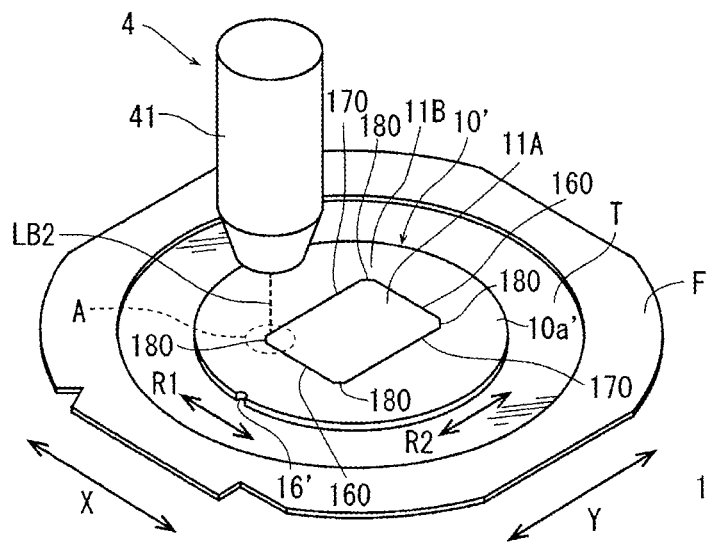
FIG. 7A is a perspective view illustrating an embodiment different from the embodiments of a laser processing method illustrated in FIG. 2 to FIG. 6.

Subsequently, the light collector 41 of the laser beam irradiation unit 4 is positioned directly above a processing start position on the short side 160 along the first direction R1 on the basis of the position information detected by the above-described imaging unit 5. Then, the focal point of the laser beam LB2 with a wavelength having absorbability with respect to the wafer 10' is positioned to a front surface 10a' of the wafer 10' and processing feed of the wafer 10' is executed in the X-axis direction to form first processing marks that serve as dividing grooves along the short sides 160 along the first direction R1 in the wafer 10' as illustrated in FIG. 7A. When irradiation with the laser beam LB2 is executed under the laser processing condition of the present embodiment, the irradiation with the laser beam LB2 is repeated on the same line approximately ten times to form the dividing groove that penetrates the wafer 10' to reach the back surface side of the wafer 10'. The first processing marks formed of the dividing grooves are formed along the short sides 160 as described above, and the first processing step is completed.

The laser processing executed in the present embodiment is executed under the following laser processing condition, for example.

Wavelength: 355 nm
Repetition frequency: 100 kHz
Spot diameter: 10 μm
Irradiation interval: 0.5 μm
Average output power: 3 W After the above-described first processing step is completed, the wafer 10 is rotated by 90 degrees together with the chuck table 35, and the long sides 170 along the second direction R2 are aligned in the X-axis direction. Then, the light collector 41 of the laser beam irradiation unit 4 is positioned to a processing start position on the long sides 170. Then, the focal point of the laser beam LB2 based on the above-described laser processing condition is positioned to the front surface 10a' of the wafer 10' and irradiation is executed and processing feed of the wafer 10' is executed in the X-axis direction to form second processing marks formed of dividing grooves along the long sides 170 of the wafer 10', so that the second processing step is completed.

Figure 7B:
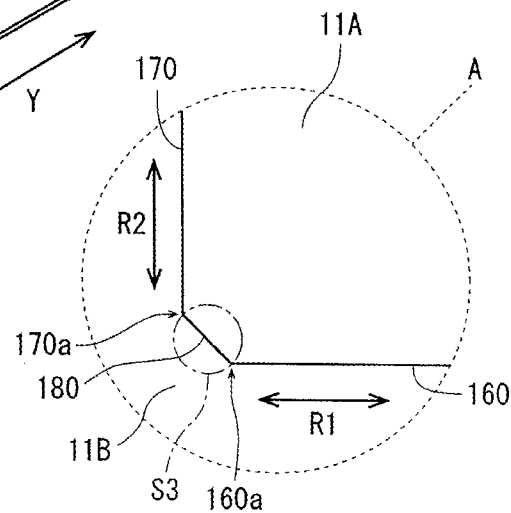
FIG. 7B is a plan view illustrating region A in FIG. 7A in an enlarged manner.

Here, in the present embodiment, as is understood from FIG. 7B illustrating region A in FIG. 7A in an enlarged manner, an unprocessed region S3 in which the processing to form the first processing marks (dividing grooves on the short sides 160) and the second processing marks (dividing grooves on the long sides 170) is not executed is formed at the intersection at which the short side 160 along the first direction R1 and the long side 170 along the second direction R2 intersect each other when the first processing marks and the second processing marks are formed along the short sides 160 and the long sides 170 by executing the first processing step and the second processing step. Although only region A illustrated in FIG. 7A is illustrated in an enlarged manner in FIG. 7B, similar unprocessed regions S3 are formed at all of four intersections at which the short sides 160 along the first direction R1 and the long sides 170 along the second direction R2 intersect each other.

After the above-described unprocessed regions S3 are formed, the unprocessed region processing step of processing the unprocessed regions S3 is executed. In the unprocessed region processing step, as illustrated in FIG. 7B, a coupling processing mark 180 formed of a dividing groove that couples an end part 160a of the short side 160 and an end part 170a of a long side 170 to each other is formed through executing irradiation with the laser beam LB2 based on the above-described laser processing condition in a direction arising from setting an inclination with respect to the short side 160 along the first direction R1 and the long side 170 along the second direction R2. The unprocessed region processing step is completed by executing similar processing also for the unprocessed regions S3 at the other three intersections. Through the above, the laser processing method of the present embodiment is completed and the wafer 10' can be divided into the plate-shaped member 11A and the annular member 11B.

According to the laser processing method of the present embodiment, the first processing mark (dividing groove) formed along the short side 160 along the first direction R1 and the second processing mark (dividing groove) formed along the long side 170 along the second direction R2 orthogonal to the first direction R1 are coupled to each other by the coupling processing mark 180 formed with an inclination, and the short side 160 along the first direction R1 and the long side 170 along the second direction R2 are not orthogonal to each other at the intersection. This eliminates a problem that cracks of approximately several tens of micrometers are radially generated at the intersection and the quality of the plate-shaped member 11A and the annular member 11B obtained by dividing is lowered.

In the above-described embodiments, the following examples have been explained: the example in which the focal point of the laser beam LB1 with a wavelength having transmissibility with respect to the wafer 10 is positioned to the inside of the wafer 10 and irradiation is executed to form the modified layer; and the example in which the focal point of the laser beam LB2 with a wavelength having absorbability with respect to the wafer 10' is positioned to the front surface of the wafer 10' and irradiation is executed to execute ablation processing and form the dividing groove. However, the present invention is not limited thereto. For example, the laser processing method of the present invention may be what forms a shield tunnel that is formed of a fine pore and an altered layer surrounding the fine pore and serves as an origin of dividing through positioning the focal point of a laser beam with a wavelength having transmissibility with respect to the wafer 10 to the inside of the wafer 10 and executing irradiation. The laser processing condition when the shield tunnel is formed can be set to the following condition, for example (as for details of other processing conditions, refer to the above-mentioned Japanese Patent Laid-open No. 2014-221483).

Wavelength: 1064 nm
Repetition frequency: 100 kHz

Spot diameter: 2 μm

Irradiation interval: 5 μm

Average output power: 4 W

Furthermore, in the above-described embodiments, the examples in which the wafer 10 or 10' that is the plate-shaped workpiece to be processed by the laser processing method of the present invention is composed of Si have been explained. However, the present invention is not limited thereto. For example, the plate-shaped workpiece may be a GaAs wafer. Furthermore, the plate-shaped workpiece may be a wafer of a hexagonal crystal material, such as a SiC wafer, LT wafer, or $SiO_2$ wafer. Moreover, in the above-described embodiment, description has been made about the case in which the crystal orientation D of the wafer 10 that is the workpiece is inclined by 45 degrees with respect to the first planned dividing lines 14a and the second planned dividing lines 14b in plan view. However, the present invention is not limited thereto. Whichever direction the crystal orientation D is in, the above-described operation and effect can be obtained by the laser processing method of the present invention.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A laser processing method in which a plate-shaped workpiece is irradiated with a laser beam and processing is executed, the laser processing method comprising:

a first processing step of forming a first processing mark in the workpiece by executing processing to form an origin of a first dividing groove through executing irradiation with the laser beam in a first direction; and a second processing step of forming a second processing mark in the workpiece by executing processing to form an origin of a second dividing groove through executing irradiation with the laser beam in a second direction that intersects the first direction, wherein an unprocessed region in which the processing is not executed is remains at an intersection at which the first direction and the second direction intersect each other in the first processing step or the second processing step, the laser processing method further comprising an unprocessed region processing step of processing the unprocessed region, wherein the unprocessed region processing step includes:

forming first coupling processing marks in the workpiece that couple the first processing mark and the second processing mark to each other by executing processing to form an origin of a first coupling dividing groove through executing irradiation with the laser beam in a direction arising from setting an inclination with respect to the first direction or the second direction, forming second coupling processing marks in the workpiece that couple the first processing mark and the second processing mark to each other by executing processing to form an origin of a second coupling dividing groove through executing irradiation with the laser beam in a direction arising from setting an inclination with respect to the first direction or the second direction, wherein the first coupling processing marks and the second coupling processing marks are not coupled to each other at the same place on the first dividing groove.

2. The laser processing method according to claim 1, wherein the first processing mark and the second processing mark are modified layers formed through positioning a focal point of a laser beam with a wavelength having transmissibility with respect to the workpiece to an inside of the workpiece and executing irradiation.

3. The laser processing method according to claim 1, wherein the first processing mark and the second processing mark are shield tunnels that are formed through positioning a focal point of a laser beam with a wavelength having transmissibility with respect to the workpiece to an inside of the workpiece and executing irradiation, and that are formed of a fine pore and an altered layer surrounding the fine pore.

4. The laser processing method according to claim 1, wherein the first processing mark and the second processing mark are grooves formed by ablation processing through positioning a focal point of a laser beam with a wavelength having absorbability with respect to the workpiece to the workpiece and executing irradiation.

5. The laser processing method according to claim 1, wherein the plate-shaped workpiece is a wafer on which a plurality of devices are formed on a front surface in such a manner as to be marked out by a plurality of planned dividing lines that intersect each other, and the first direction and the second direction are directions of the planned dividing lines.

6. The laser processing method according to claim 1, wherein the plate-shaped workpiece is a silicon wafer or a GaAs wafer in which a crystal orientation is inclined by 45 degrees with respect to the first direction and the second direction.

7. The laser processing method according to claim 1, wherein the plate-shaped workpiece is selected from a group consisting of a silicon carbide wafer, a lithium tantalate wafer, and a silicon dioxide wafer.

8. The laser processing method according to claim 1, wherein before forming the first and second coupling processing marks, the workpiece is rotated 90 degrees so that the first dividing groove is aligned in the X-direction.

* * * * *